United States Patent Office 3,484,657
Patented Dec. 16, 1969

3,484,657

SEMICONDUCTOR DEVICE HAVING INTERMETALLIC COMPOUNDS PROVIDING STABLE PARAMETER VS. TIME CHARACTERISTICS

Susanna Gukasovna Madoian, Scherbakovskaya ul. 57, kv. 189, and Alexandr Mikhailovich Zubkov, Avtovavodskaya ul. 19, korpus 1, kv. 22, both of Moscow, U.S.S.R.

Filed July 11, 1966, Ser. No. 563,949
Int. Cl. H01l 3/00, 5/00
U.S. Cl. 317—234 4 Claims

ABSTRACT OF THE DISCLOSURE

The invention is directed to enhancing the stability of the parameters of semiconductor devices, such as tunnel diodes, and the like, operated at high values of forward currents and comprises making the p-n junctions of said devices in the form of heterojunctions in which the forbidden band width of the n-region is smaller than that of the p-region, one region of said p-n heterojunction being obtained in the course of incorporating an alloy into a semiconductive material wafer due to the chemical reaction of the alloy components with the wafer material that dissolves in the alloy during alloying, which reaction yields a novel semi-conductive material whose composition and characteristics are dissimilar to those of the wafer, such that the width of the forbidden band is different from that of the wafer. To bring about said reaction, the alloy contains appropriate components which, under the alloying temperature conditions used and in the medium resorted to, are capable of reacting with the wafer material, whereupon the desired semi-conductive material is obtained.

For example, where use is made of a wafer consisting of p-type gallium arsenide, it is practicable to make $nGa_{1-x}In_x$ As—pGaAs p-n heterojunctions by alloying with the wafer at a temperature of 560–620° C., tin containing 5–20 wt. percent indium or 5–20 wt. percent indium arsenide.

The present invention relates to semiconductor devices, employing intermetallic semiconductor materials with high concentration of alloying additions, and more particularly it relates to tunnel diodes.

Known in the art are semiconductor devices, for example tunnel diodes, having a p-n junction, which is formed by fusing a metal electrode into a crystal, for example of gallium arsenide alloyed with zinc. The n-area in such devices is formed by a recrystallized layer of gallium arsenide, containing a donor impurity, introduced from the fused electrode; the width of the forbidden band in the n-area being approximately equal to the width of the forbidden band in the p-area.

A disadvantage of such devices is that during the operation of the device in the conditions when the working point periodically or for a certain period of time remains on the diffusion branch of the volt-ampere characteristic, the value of the maximum diode current continuously decreases. These alternations are of a non-reversible character, being the more considerable the higher the extent of alloying of the starting material.

An object of the present invention is to provide a semiconductor device, in which the maximum current has a constant value during the continuous operation of the device at the diffusion branch of the volt-ampere characteristic.

The essential feature of the present invention consists in that in the semiconductor device the p-n-p junction is a hetero-junction, being formed by introducing into the fused-in metal electrode, an impurity, which is capable of forming with at least one component of a crystal electrode material a semiconductor material having a width of the forbidden band different from that of the forbidden band of the material of the crystal electrode.

As to the tunnel diode, whose crystalline electrode is made of gallium arsenide, it is possible to employ indium or indium arsenide as an impurity of the fused-in metal electrode.

For semiconductor devices, in which the p-n junction is formed by fusing tin into the crystalline gallium arsenide, it is expedient to employ indium or indium arsenide in an amount of 5 to 20 percent by weight.

Below is given the description of an exemplary embodiment of semiconductor devices according to the present invention.

To manufacture the tunnel diode, there is employed a crystal of gallium arsenide, alloyed with zinc up to a concentration of $>3.10^{19}$ atm./cm.$^3$, while its p-n junction is formed by fusing an alloy of tin with indium into the crystal.

The content of indium in the alloy amounts to as much as 5 to 20 percent by weight. The fusing operation is effected in a hydrogen atmosphere. The maximum temperature of fusing is between 560 to 620° C. with the portion of gallium arsenide being dissolved in the tin-indium alloy. The subsequent cooling brings about its recrystallization. The recrystallized layer obtained thereby is of a more complex composition than the initial material, for a portion gallium atoms in the crystal lattice is replaced with atoms of indium. Thus, the n-area of the p-n junction, formed in the process of fusing, is a semiconductor material, the molecular formula of which comprises $(1-x)$ atoms of gallium, $x$ atoms of indium and one atom of arsenic. This semiconductor material is alloyed with tin.

The width of the forbidden band for solid solutions of the type GaAs—InAs as compared with the width of the forbidden band of gallium arsenide is lower for increased amounts of the content of InAs in the recrystallized layer.

For this reason, in the p-n junction obtained, the n-type area has a smaller width of the forbidden band than that of the p-type area. In the embodiment under consideration, the p-area is alloyed with an acceptor impurity in a considerably greater extent than the n-area with the donor impurity, on account of which the density of the injection current of holes from the p-area into the n-area markedly increases. The density of current of electrons from the n-area into the p-area decreases accordingly. Such a diode makes it possible to obtain the same density of diffusion currents as that in a diode with a homogeneous p-n junction with lower voltages of direct displacement.

The contact difference of potentials in the p-n junction being practically constant, a great value of the retarding field is preserved in it, which prevents electrons from moving into the p-area and ions from diffusing out of the p-area.

The tunnel diodes of the p-type with a crystalline electrode of gallium arsenide, having the n-area of the composition $Ga_{1-x}In_xAs$, differ from the tunnel diodes with a homogeneous p-n junction in a lower value of voltage drop, which is about 850 to 1100 mv. instead of the ordinary 1100 to 1250 mv., and in lower ratios of currents $I_{max}/I_{min}$.

By introducing into the fused-in crystalline electrode, indium arsenide in an amount of 5 to 20 percent by weight there is formed a p-n junction of the same structure and properties as those in the above-said embodiment with the use of indium.

The proposed tunnel diode of the p-type, whose crystalline electrode is made of gallium arsenide, and in which the n-area, having a lower content of alloying elements, has a narrower forbidden zone than the p-area and has an advantage that it allows operation at the diffusion branch of a voltampere characteristic with a current equal to maximum, and with ratios of the working current to the capacity of the p-n junction equal to or exceeding 2. Under such conditions, the degradation phenomenon is absent, or is present only to an insignificant extent.

This allows utilization of such devices in computing machines operating at high frequencies.

The invention will next be described with reference to the attached drawings.

Figure 1:
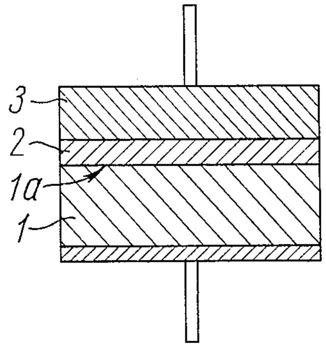
FIGURE 1 is a diagrammatic illustration of the structure of the device according to the invention.

There is shown diagrammatically in FIG. 1 the structure of the device according to the present invention, which comprises a wafer 1 consisting of an intermetallic semiconductor compound, e.g., gallium arsenide, a region consisting of another semiconductive material 2 obtained when an alloy 3 is alloyed to the wafer 1 and there occurs a chemical reaction between the material of the wafer 1 dissolved in the alloy 3, the components of the alloy 3 being capable of producing, at the alloying temperature used, in conjunction with at least one component of the wafer 1, a new semiconductive material in the region 2, the forbidden band width of this novel material being smaller than that of the material from which the wafer 1 is made, and the heterojunction 1*a* thus formed at the boundary of the regions 1 and 2 being characterized by a forbidden band width at the n-region which is smaller than that of the p-region.

Figure 2:
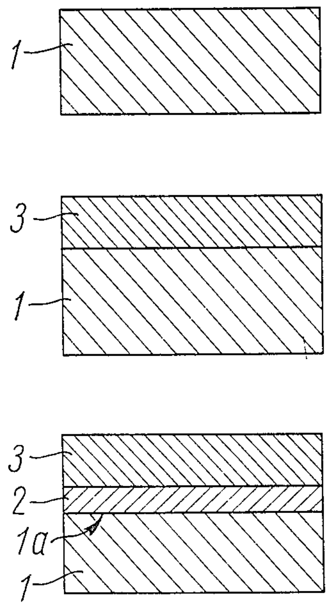
FIGURE 2 shows the steps of manufacturing a heterojunction.

FIG. 2 shows the steps involved in the fabrication of the p-n junction in the device according to the present invention, wherein *a* is the step of the preparation of the wafer 1; *b* denotes the application of the alloy 3 onto the surface of the wafer 1; and *c* illustrates heat treatment at a sufficient temperature for carrying out the chemical reaction between at least one component of the alloy 3 and the material of the wafer 1 to obtain the novel semiconductor intermetallic compound 2 whose forbidden band width differs from that of wafer 1.

Figure 3:
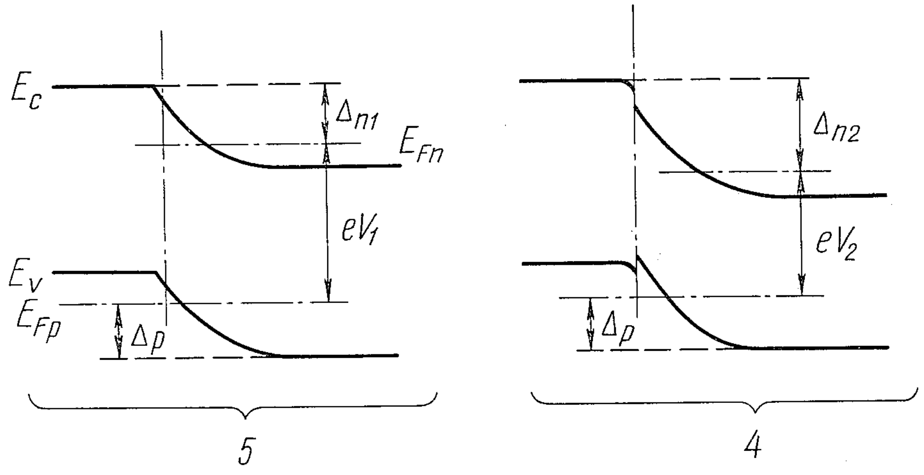
FIGURE 3 shows zone diagrams of two forward-biased p-n junctions.

FIG. 3 illustrates the zone structure 4 of the p-n heterojunction 1*a* and also shows, by way of comparison, the zone structure 5 of the p-n homogeneous junction, in which the p- and n-regions are fabricated from the same material as in the p-region of the heterojunction 1*a*. For the sake of clarity, the zone structures 4 and 5 relate to specific types of p-n junctions, viz, to tunnel p-n junctions, which are shown to be forward biased when the working point is at the diffusion branch of the volt-ampere characteristic.

Figure 4:
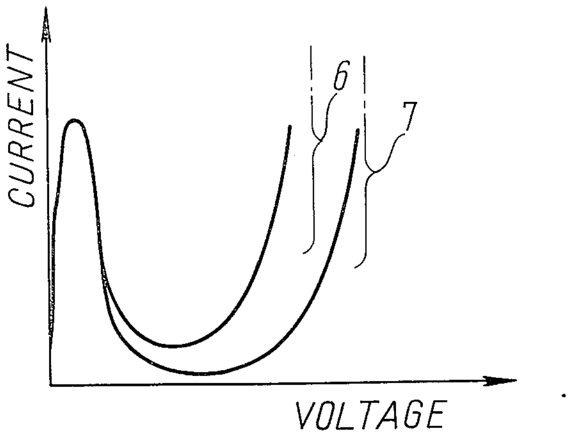
FIGURE 4 is a diagram of volt-ampere characteristics of tunnel diodes.

The diffusion branches of volt-ampere characteristics can be seen in FIG. 4 where they are denoted with numerals 6 and 7.

As can be seen in FIG. 3, while the energy barrier ($\Delta_p$) of the hole component of the current has an equal value for both junctions, the energy barrier for the electron component of the current in the p-n junction 4 is greater than that of the homogeneous p-n junction 5, viz, $\Delta_{n2} > \Delta_{n1}$, so that the electron component of the current in the p-n heterojunction 4 is considerably lower than that in the p-n junction 5.

Moreover, one and the same energy barrier ($\Delta_p$) for the hole current in the p-n heterojunction 4 is attained at a lower voltage $V_2$ than in the case of the p-n junction 5, so that $V_2 < V_1$. This situation, in turn, results in the diffusion branch 6 of the volt-ampere characteristic of the p-n junction 4 being biased to a lower voltage area than is the diffusion branch 7 of the volt-ampere characteristic of the p-n junction 5. Diminution of the electron component of the current and lowering of the bias voltage, the diffusion current density being the same, results in a decreased degradation of the device having the p-n heterojunction 4 as compared to that of the device having the homogeneous p-n junction 5.

Figure 5:
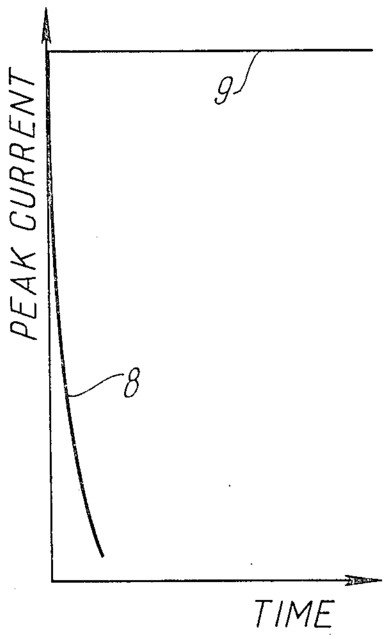
FIGURE 5 is a graphical illustration of the variation in peak current with time for a diode of the present invention and for a conventional diode.

In FIG. 5, curve 8 shows the variation of the peak current with time for a gallium arsenide diode having a conventional p-n junction, while curve 9 illustrates peak current variation in the diode, according to the present invention, wherein the region 1 is comprised of p-type gallium arsenide. In both cases, working current densities were identical.

Though the present invention is described in connection with its preferred embodiment, it is evident that there may be allowed modifications and alterations that do not depart from the concept and scope of the invention, which will be readily understood by those skilled in the art. These modifications and alterations are considered as falling within the spirit and scope of the invention, as defined in the appended claims.

What is claimed is:

1. A semiconductor device comprising a crystalline electrode of gallium arsenide, a metal electrode fused to said crystalline electrode and constituted as a tin-base alloy doped with indium, the dopant being capable of reacting, while fusing said metal electrode to said crystalline electrode, with at least one component of the material of said crystalline electrode to yield a semi-conductive material having a width of forbidden band which differs from that of the forbidden band of said crystalline electrode, the content of indium in said metal electrode being 5–20% by weight; and a p–n heterojunction at the boundary between said crystalline electrode and said semi-conductive material obtained as a result of fusing said metal electrode to said crystalline electrode.

2. A semiconductor device comprising a crystalline electrode of gallium arsenide; a metal electrode fused to said crystalline electrode and constituted as a tin-base alloy doped with indium arsenide, the dopant being capable of reacting, while fusing said metal electrode to said crystalline electrode, with at least one component of the material of said crystalline electrode to yield a semiconductive material having a width of forbidden band which differs from that of the forbidden band of said crystalline electrode, the content of indium arsenide in said metal electrode being 5–20% by weight; and a p-n heterojunction at the boundary between said crystalline electrode and said semi-conductive material obtained as a result of fusing said metal electrode to said crystalline electrode.

3. A semiconductor device comprising a crystalline electrode of p-type gallium arsenide; a metal electrode fused to said crystalline electrode and constituted as a tin-base alloy doped with inidium, the dopant being capable of reacting, while fusing said metal electrode to said crystalline electrode, with at least one component of the material of said crystalline electrode to yield a semiconductive material having a width of forbidden band which differs from that of the forbidden band of said crystalline electrode, the content of indium in said metal electrode being 5–20% by weight; and a p-n heterojunction at the boundary between said crystalline electrode and said semi-conductive material obtained as a result of fusing said metal electrode to said crystalline electrode, the n-region in said heterojunction being a complex of gallium, indium and arsenic and having a narrower forbidden band than that in the p-region.

4. A semiconductor device comprising a crystalline electrode of p-type gallium arsenide; a metal electrode fused to said crystalline electrode and constituted as a tin-base alloy doped with indium arsonide, the dopant being capable of reacting, while fusing said metal electrode to said crystalline electrode, with at least one component of the material of said crystalline electrode to yield a semi-conductive material having a width of forbidden band which differs from that of the forbidden band of said crystalline electrode, the content of indium arsenide in said metal electrode being 5–20% by weight; and a p-n heterojunction at the boundary between said crystalline electrode and said semi-conductive material obtained as a result of fusing said metal electrode to said crystalline electrode, the n-region in said heterojunction being a complex of gallium, indium and arsenic and having a narrower forbidden band than that in the p-region.

References Cited

UNITED STATES PATENTS

| | | |
|---|---|---|
| 3,351,502 | 11/1967 | Rediker. |
| 3,110,849 | 11/1963 | Soltys. |
| 3,251,757 | 5/1966 | Schmitz. |
| 3,291,658 | 12/1966 | Butler et al. |

JERRY D. CRAIG, Primary Examiner

U.S. Cl. X.R.

148—33.4, 177